United States Patent
Nakamura

(10) Patent No.: US 11,323,041 B2
(45) Date of Patent: May 3, 2022

(54) SEMICONDUCTOR DEVICE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 485 days.

(21) Appl. No.: 15/091,089

(22) Filed: Apr. 5, 2016

(65) Prior Publication Data

US 2017/0033705 A1 Feb. 2, 2017

(30) Foreign Application Priority Data

Jul. 27, 2015 (JP) .............................. JP2015-147651

(51) Int. Cl.
*H02M 7/00* (2006.01)
*H01L 27/06* (2006.01)
(Continued)

(52) U.S. Cl.
CPC ........ *H02M 7/003* (2013.01); *H01L 27/0664* (2013.01); *H01L 29/1602* (2013.01);
(Continued)

(58) Field of Classification Search
CPC ..... H02M 7/003; H02M 7/44; H01L 29/2003; H01L 29/7397; H01L 29/1608;
(Continued)

(56) References Cited

U.S. PATENT DOCUMENTS 2,864,977 A * 12/1958 Witt ..................... H01R 12/721
361/736
3,629,672 A * 12/1971 Van De Water .... H01L 23/4334
257/675
(Continued)

FOREIGN PATENT DOCUMENTS

DE          2950046 A1 *  6/1981   ............... H02K 7/11
DE          4228253 A1 *  3/1993   ....... H01L 23/49555
(Continued)

OTHER PUBLICATIONS

Clark et al., "New SLIM Package Intelligent Power Modules (SLIMDIP) with thin RC-IGBT for consumer Goods Applications", Energy Conversion Congress and Exposition (ECCE), IEEE Sep. 20-25, 2015, pp. 4510-4512.*
(Continued)

*Primary Examiner* — Vincent Wall
(74) *Attorney, Agent, or Firm* — Studebaker & Brackett PC

(57) ABSTRACT

A higher-current device is implemented by increasing cross-sectional areas of terminals while securing solderability during mounting. The device makes securing of a creepage distance between terminals compatible with a reduction in package size. A semiconductor device 1 is provided with a package 2, a semiconductor circuit 3, a control circuit 6, a plurality of main terminals 7 and control terminals 8. Each main terminal 7 is configured of a plurality of subterminals S1, S2 and S3 arranged at mutually neighboring positions and projecting from the package 2. Distal end portions of the subterminals S1, S2 and S3 making up the same main terminal 7 are bent toward a mounting surface on which the semiconductor device 1 is mounted and the bending positions of the subterminals S1, S2 and S3 are configured to
(Continued)

differ between the mutually neighboring subterminals S1 and S2, and subterminals S2 and S3.

7 Claims, 3 Drawing Sheets

(51) Int. Cl.
*H01L 29/16* (2006.01)
*H01L 29/20* (2006.01)
*H01L 29/739* (2006.01)
*H02M 7/44* (2006.01)

(52) U.S. Cl.
CPC ...... *H01L 29/1608* (2013.01); *H01L 29/2003* (2013.01); *H01L 29/7397* (2013.01); *H02M 7/44* (2013.01)

(58) Field of Classification Search
CPC . H01L 29/1602; H01L 27/0664; H01L 23/50; H01L 25/07; H01L 25/18
See application file for complete search history.

(56) References Cited

U.S. PATENT DOCUMENTS

| | | | | |
|---|---|---|---|---|
| 4,725,692 | A * | 2/1988 | Ishii | H01L 23/49541 174/531 |
| 4,951,124 | A * | 8/1990 | Sawaya | H05K 3/308 257/692 |
| 5,450,289 | A * | 9/1995 | Kweon | H01L 23/49555 361/773 |
| 5,814,884 | A * | 9/1998 | Davis | H01L 23/49562 257/497 |
| 6,239,514 | B1 * | 5/2001 | Isberg | H01H 9/542 218/18 |
| 6,410,365 | B1 * | 6/2002 | Kawata | H01L 21/565 438/123 |
| 6,573,119 | B1 * | 6/2003 | Hirashima | H01L 21/565 257/E21.504 |
| 2004/0004272 | A1 * | 1/2004 | Luo | H01L 23/49575 257/666 |
| 2005/0258849 | A1 * | 11/2005 | Hauser | H01L 23/49555 324/756.02 |
| 2006/0255362 | A1 | 11/2006 | Otremba | |
| 2007/0173134 | A1 * | 7/2007 | Takahashi | H05K 3/308 439/733.1 |
| 2008/0246128 | A1 * | 10/2008 | Yang | H01L 23/49555 257/666 |
| 2009/0212284 | A1 | 8/2009 | Otremba et al. | |
| 2009/0224394 | A1 * | 9/2009 | Narita | H01L 23/49541 257/690 |
| 2011/0235348 | A1 * | 9/2011 | Tateishi | H01R 12/58 362/459 |
| 2012/0261825 | A1 | 10/2012 | Koike et al. | |
| 2013/0146347 | A1 * | 6/2013 | McConnell | H01G 4/38 174/260 |
| 2014/0184303 | A1 | 7/2014 | Hasegawa et al. | |
| 2014/0210093 | A1 * | 7/2014 | Wang | H01L 23/36 257/773 |
| 2014/0239489 | A1 | 8/2014 | Yoneda | |
| 2015/0348882 | A1 * | 12/2015 | Yeo | H05K 1/18 361/773 |
| 2016/0035657 | A1 | 2/2016 | Tomioka et al. | |
| 2016/0118320 | A1 * | 4/2016 | Coppone | H01L 23/49568 257/666 |
| 2016/0163615 | A1 * | 6/2016 | Mitamura | H01L 27/0664 257/140 |
| 2017/0077020 | A1 * | 3/2017 | Mabuchi | H01L 23/49838 |

FOREIGN PATENT DOCUMENTS

| | | | |
|---|---|---|---|
| DE | 10 2005 018 941 A1 | 11/2006 | |
| DE | 10 2009 009 874 A1 | 9/2009 | |
| DE | 10 2015 212 663 A1 | 2/2016 | |
| JP | 60253251 A * | 12/1985 | ............. H01L 23/48 |
| JP | S62-276864 A | 12/1987 | |
| JP | S63-066957 A | 3/1988 | |
| JP | H07-106510 A | 4/1995 | |
| JP | H07-307544 A | 11/1995 | |
| JP | H11-135702 A | 5/1999 | |
| JP | 2005-051109 A | 2/2005 | |
| JP | 2005051109 A * | 2/2005 | |
| JP | 2008-218575 A | 9/2008 | |
| JP | 2008218575 A * | 9/2008 | |
| JP | 2009-027090 A | 2/2009 | |
| JP | 2011-124283 A | 6/2011 | |
| JP | 2012-147040 A | 8/2012 | |
| JP | 2013-125848 A | 6/2013 | |
| JP | 2014-130909 A | 7/2014 | |

OTHER PUBLICATIONS

Mitsubishi Electric, Super mini DIP-IPM Ver. 4 Application note, Jan. 2008.*
English translation of JP2013-125848.*
English translation of JPS-6366957.*
Data Sheet NEC uPD78CP18(A).*
Machine translation of abstract of jp60253251A.*
Mitsubishi PSS05S92F6-AG data sheet, pp. 1-12, Mar. 2014 (Year: 2014).*
Japanese office action for JP application 2015-147651 dated Jun. 26, 2018 (Year: 2018).*
JP-2005051109-A machine translation (Year: 2005).*
JP-2008218575-A machine translation (Year: 2008).*
R6511Q—Rockwell data sheet, Jun. 1987 (Year: 1987).*
An Office Action mailed by the Japanese Patent Office dated Jun. 26, 2018, which corresponds to Japanese Patent Application No. 2015-147651 and is related to U.S. Appl. No. 15/091,089.
An Office Action mailed by The State Intellectual Property Office of the People's Republic of China dated May 23, 2019, which corresponds to Chinese Patent Application No. 201610602548.2 and is related to U.S. Appl. No. 15/091,089.
The Second Office Action mailed by the State Intellectual Property Office of the People's Republic of China dated Jan. 24, 2019, which corresponds to Chinese Patent Application No. 201610602548.2 and is related to U.S. Appl. No. 15/091,089.
An Office Action mailed by the Japanese Patent Office dated Dec. 11, 2018, which corresponds to Japanese Patent Application No. 2015-147651 and is related to U.S. Appl. No. 15/091,089.
An Office Action mailed by the State Intellectual Property Office of the People's Republic of China dated Jun. 1, 2020, which corresponds to Chinese Patent Application No. 201610602548.2 and is related to U.S. Appl. No. 15/091,089; with English language translation.
An Office Action mailed by the German Patent Office dated Jan. 14, 2020, which corresponds to German Patent Application No. 10 2016 212 360.2 and is related to U.S. Appl. No. 15/091,089.
An Office Action mailed by The State Intellectual Property Office of the People's Republic of China dated Dec. 18, 2019, which corresponds to Chinese Patent Application No. 201610602548.2 and is related to U.S. Appl. No. 15/091,089.

* cited by examiner

SEMICONDUCTOR DEVICE

FIELD

The present invention relates to a semiconductor device, and more particularly, to a package type semiconductor device provided with a plurality of terminals.

BACKGROUND

According to prior arts, power semiconductor devices such as DIPIPM (Dual Inline Package Intelligent Power Module) are often configured to include one terminal for one function. In recent years, with the improvement in performance of semiconductor modules, there is a tendency to adopt smaller-size and higher-current specifications for semiconductor devices. However, carrying a high current requires cross-sectional areas of terminals to be increased. Examples of methods of increasing the cross-sectional areas include a method that thickens a main terminal to be used for carrying a main current and a method that increases the number of terminals. A prior art described in Japanese Patent Application Laid-Open No. 2005-51109 increases the number of terminals to thereby increase their cross-sectional areas.

Patent Literature 1: Japanese Patent Laid-Open No. JP 2005-51109 A
Patent Literature 2: Japanese Patent Laid-Open No. JP 63-066957 A
Patent Literature 3: Japanese Patent Laid-Open No. JP 62-276864 A
Patent Literature 4: Japanese Patent Laid-Open No. JP 2011-124283 A
Patent Literature 5: Japanese Patent Laid-Open No. JP 7-106510 A
Patent Literature 6: Japanese Patent Laid-Open No. JP 2013-125848 A
Patent Literature 7: Japanese Patent Laid-Open No. JP 7-307544 A

SUMMARY

However, according to the method that simply thickens the terminals, such as the prior art described in Japanese Patent Application Laid-Open No. 2005-51109, the periphery of the terminals may not be sufficiently wetted with solder when a module is mounted on a printed circuit board, which may result in a problem that solderability deteriorates, making it difficult to stably connect the terminals. On the other hand, according to the method that increases the number of terminals, there is a limit in reducing a distance between terminals in consideration of securing a creepage distance between the terminals and a distance between through holes during mounting, which may result in a problem that package sizes of semiconductor devices increase.

The present invention has been implemented to solve the above-described problems, and it is an object of the present invention to provide a semiconductor device capable of achieving a high current by increasing cross-sectional areas of terminals while securing solderability during mounting, and making securing of a creepage distance between terminals compatible with a reduction in package size.

A semiconductor device of the invention is a device which comprises a package making up a contour, a semiconductor circuit that is accommodated in the package and controls a main current according to a control signal from outside, a control terminal that projects from the package and inputs a control signal to the semiconductor circuit, and a plurality of main terminals that are terminals that carry a main current to the semiconductor circuit and have different functions for the semiconductor circuit, wherein at least one main terminal of the main terminals are configured of a plurality of subterminals projecting from the package at mutually neighboring positions, and distal end portions of the subterminals making up the same main terminal are bent toward a mounting surface on which the semiconductor device is mounted and bending positions of the subterminals are caused to differ between the mutually neighboring subterminals.

According to the present invention, the main terminal is configured of a plurality of subterminals, and it is thereby possible to increase a cross-sectional area of each main terminal and increase a current-carrying quantity. Moreover, by dividing the main terminal into a plurality of subterminals, it is possible to increase an area in which solder is adhered to the main terminal during mounting of the semiconductor device. This makes it possible to secure solderability during mounting. Therefore, it is possible to realize a high-current type semiconductor device with high reliability. Moreover, since bending positions of mutually neighboring subterminals are made to differ from each other, it is possible to cause distal end portions of the subterminals to sufficiently separate from each other while securing a minimum possible interval between the subterminals. As a result, it is possible to sufficiently secure the creepage distance between the subterminals on the mounting substrate and an interval between through holes through which the subterminals are inserted while reducing the size of the semiconductor device.

DESCRIPTION OF EMBODIMENTS

Figure 1:
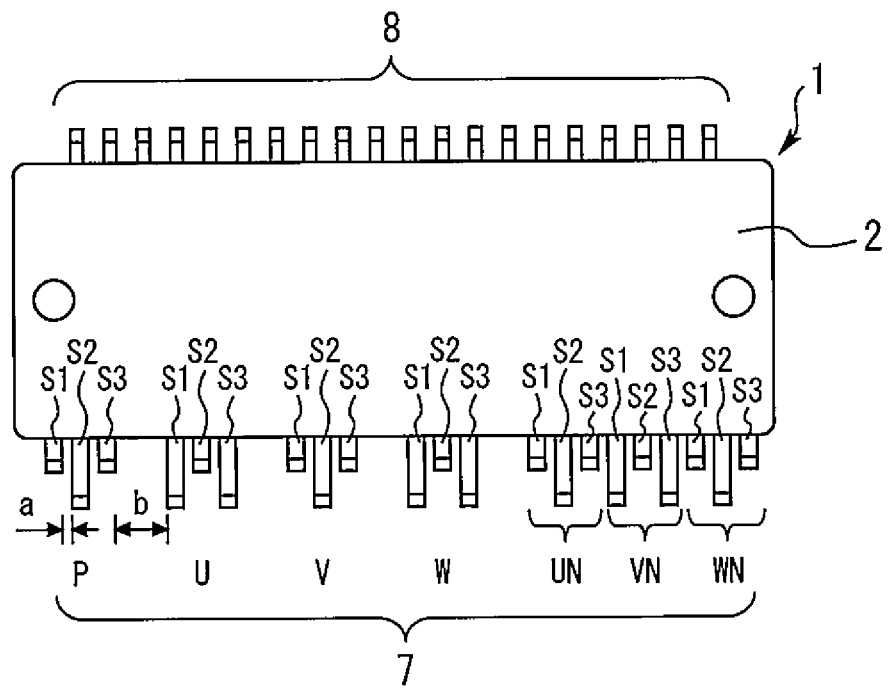
FIG. 1 is a bottom view of a semiconductor device according to the first embodiment of the present invention.

Hereinafter, embodiments of the present invention will be described with reference to the accompanying drawings. Note that common elements among drawings used in the present specification are assigned the same reference numerals and duplicate description will be omitted. The present invention is not limited to the following embodiments but can be modified in various ways without departing from the spirit and scope of the present invention. The present invention includes all possible combinations of configurations shown in the following embodiments.

First Embodiment

Figure 2:
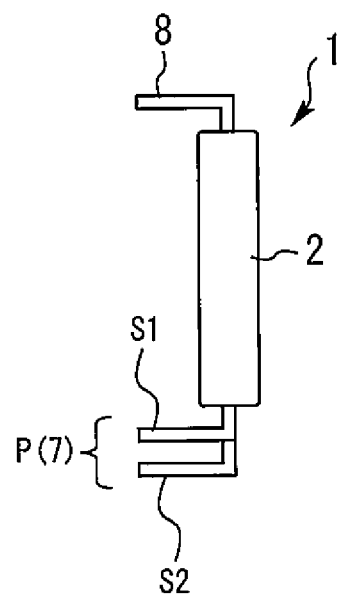
FIG. 2 is a side view of the semiconductor device in FIG. 1.
Figure 3:
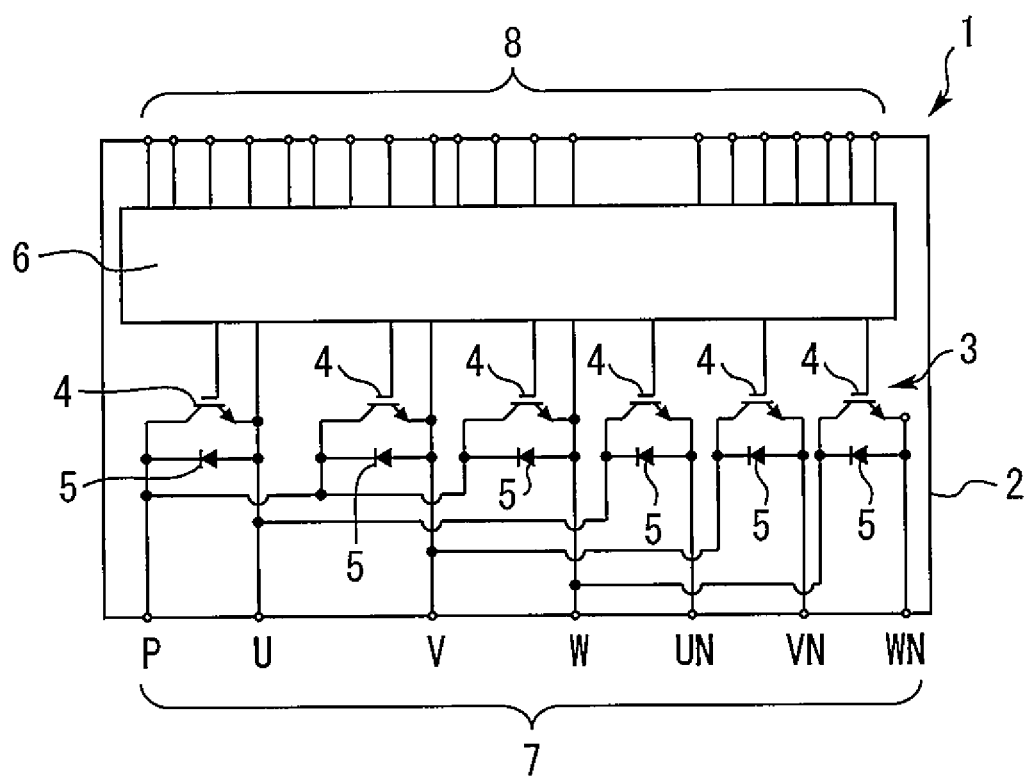
FIG. 3 is a circuit diagram of a semiconductor circuit mounted on the semiconductor device in FIG. 1.

A first embodiment of the present invention will be described with reference to FIG. 1 to FIG. 3. FIG. 1 is a bottom view of a semiconductor device according to the first embodiment of the present invention. FIG. 2 is a side view of the semiconductor device. FIG. 3 is a circuit diagram of a semiconductor circuit mounted on the semiconductor device. As shown in these drawings, the semiconductor device 1 of the present embodiment has an external appearance and a shape of a transfer mold type power module, for example, and is provided with a package 2, a semiconductor circuit 3, a control circuit 6, a plurality of main terminals 7 and control terminals 8.

As shown in FIG. 1 and FIG. 2, the package 2 constitutes a contour of the semiconductor device 1 and is formed of an insulating resin material. The package 2 has an elongated rectangular shape with two long sides and short sides. The semiconductor circuit 3 is airtightly accommodated in the package 2. The semiconductor device 1 is configured by mounting a semiconductor chip including the semiconductor circuit 3 and the control circuit 6 on a lead frame including the main terminals 7 and the control terminals 8, and sealing these mounted components with mold resin.

The semiconductor circuit 3 is intended to control a main current according to a control signal from outside and is configured as a three-phase inverter circuit including six IGBTs (Insulated Gate Bipolar Transistors) 4 and six FWDs (Free Wheeling Diodes) 5 in an example shown in FIG. 3. The IGBT 4 is intended to switch (ON/OFF) the main current and is configured of, for example, a wide band gap semiconductor. The wide band gap semiconductor is a generic name of a semiconductor having a wide band gap (forbidden band) compared to silicon and, for example, silicon carbide (SiC), nitride gallium (GaN), diamond are known.

Two of the IGBTs 4 are connected in series between main terminals P and UN, main terminals P and VN and main terminals P and WN respectively. A U terminal is connected between the two IGBTs 4 connected in series between the main terminals P and UN, a V terminal is connected between the two IGBTs 4 connected in series between the main terminals P and VN. Furthermore, a W terminal is connected between the two IGBTs 4 connected in series between the main terminals P and WN. On the other hand, the FWDs 5 are intended to cause a reflux current to flow when the main current is cut off by switching of the IGBTs 4 and each IGBT 4 connects a collector and an emitter. Note that the present invention is not limited to the inverter circuit but is also applicable to various semiconductor circuits other than the inverter circuit. Furthermore, a semiconductor circuit may be configured of various elements other than the IGBTs 4 and the FWDs 5 in the present invention.

The control circuit 6 is intended to drive switching or protect the circuit or the like, and is connected to each control terminal 8 and the gate of each IGBT 4 via a lead frame, wire or the like. The main terminal 7 is a generic name of the main terminals P, U, V, W, UN, VN and WN shown in FIG. 1 and is intended to carry a main current into the semiconductor circuit 3. Here, the main terminal P functions as a ground. The main terminals UN, VN and WN have functions of supplying the main current to each phase of the inverter and the main terminals U, V and W have functions of extracting AC of each phase. Thus, the individual main terminals 7 have different functions.

Furthermore, the control terminal 8 is intended to input a control signal to the semiconductor circuit 3. In the present embodiment, the main terminals 7 (main terminals P, U, V, W, UN, VN, WN) are arranged side by side on one of the two long sides of the package 2, for example, and the control terminals 8 are arranged side by side on the other long side of the package 2. These main terminals 7 and control terminals 8 are formed, for example, of elongated plates or bars and project from the package 2.

When the semiconductor device 1 configured in this way operates as an inverter circuit, a DC voltage is applied between the main terminals P and UN, between the main terminals P and VN and between the main terminals P and WN respectively and three-phase AC is outputted from the main terminals U, V and W. At this time, the semiconductor device 1 can control the output state of the three-phase AC according to control signals inputted from the control terminal 8.

Next, the configuration of the main terminal 7 which is a feature item of the present embodiment will be described with reference to FIG. 1 and FIG. 2. As shown in FIG. 1, each main terminal P, U, V, W, UN, VN, WN is configured of a plurality of (e.g., three) subterminals S1, S2 and S3 in the present embodiment. The three subterminals S1, S2 and S3 making up the same main terminal are arranged so as to neighbor each other at a prescribed interval size "a" and project from the package 2. Note that the interval size "a" between the mutually neighboring subterminals is set to be smaller than an interval size "b" between the mutually neighboring main terminals 7. The subterminals S1, S2 and S3 making up the same main terminal are respectively connected to the same region of the semiconductor circuit 3. In this connection, the subterminals S1, S2 and S3 may be integrated through the path halfway from the outside of the package 2 to the semiconductor circuit 3, but in even this case, the total cross-sectional area of the subterminals S1, S2 and S3 may be preferably equal to that of the portion located outside the package 2.

The distal end portions of the subterminals S1, S2 and S3 making up the same main terminal are bent into an L-figured shape toward the mounting surface on which the semiconductor device 1 is mounted as shown in FIG. 2. The bending positions of the subterminals S1, S2 and S3 are configured to differ between mutually neighboring subterminals in the length direction of the subterminals. Note that the mutually neighboring subterminals of the same main terminal mean, for example, the subterminals S1 and S2, and the subterminals S2 and S3, but this does not correspond to the subterminals S1 and S3.

The following is a more specific example. In the main terminals P, V, UN and WN, the bending position of the subterminal S2 in the center is set to be apart from the package 2 compared to the bending positions of the subterminals S1 and S3 on both sides. The bending positions of the subterminals S1 and S3 on both sides are set to be equal. That is, in a plan view, the bending positions of the subterminals S1, S2 and S3 are arranged in a staggered form.

Furthermore, in the other main terminals U, W and VN arranged between the above-described main terminals P, V, UN and WN, the bending position of the subterminal S2 in the center is set to a position closer to the package 2 than the bending positions of the subterminals S1 and S3 on both sides and the bending positions of the subterminals S1 and S3 on both sides are set to be equal. In a plan view, the bending positions of the subterminals S1, S2 and S3 are arranged in a staggered form in this case, too. In the present embodiment, the main terminals P, V, UN and WN in which the subterminal S2 in the center is bent at a position apart from the package 2, and the main terminals U, W and VN in which the subterminal S2 in the center is bent at a position closer to the package 2 are alternately arranged in the direction in which the main terminals are arranged side by side.

As described above in detail, according to the present embodiment, since the individual main terminals 7 are configured of the three subterminals S1, S2 and S3, it is possible to expand the cross-sectional area of each main terminal 7 and increase the current-carrying quantity. Moreover, each main terminal 7 is divided into the subterminals S1, S2 and S3, and it is thereby possible to increase the area in which solder is adhered to the main terminal 7 during mounting of the semiconductor device 1. This makes it possible to secure solderability during mounting. Therefore, it is possible to realize the high-current type semiconductor device 1 with high reliability.

Of the subterminals S1, S2 and S3, the bending positions of mutually neighboring subterminals are caused to differ from each other, and it is thereby possible to cause the distal end portions of the subterminals to sufficiently separate from each other while securing minimum intervals between the subterminals S1, S2 and S3. As a result, it is possible to sufficiently secure the creepage distance between the subterminals on the mounting substrate, the interval between through holes into which the subterminals are inserted and easily secure the interval between the through holes and their peripheries while reducing the size of the semiconductor device 1. Particularly, as the semiconductor device 1 with, for example, a built-in three-phase inverter circuit, the semiconductor device provided with the many main terminals P, U, V, W, UN, VN and WN can notably obtain the above-described effects.

In the present embodiment, the interval size "a" between the mutually neighboring subterminals is set to be smaller than the interval size "b" between the mutually neighboring main terminals 7. This makes it possible to secure a sufficient distance between the two main terminals having different functions. Therefore, it is possible to stably insulate between the main terminals in addition to the above-described effects. Furthermore, in the present embodiment, the IGBT 4 is configured of a wide band gap semiconductor. This makes it possible to promote implementation of the high-performance and high-current semiconductor circuit 3 using the wide band gap semiconductor having high heat resistance.

Second Embodiment

Figure 4:
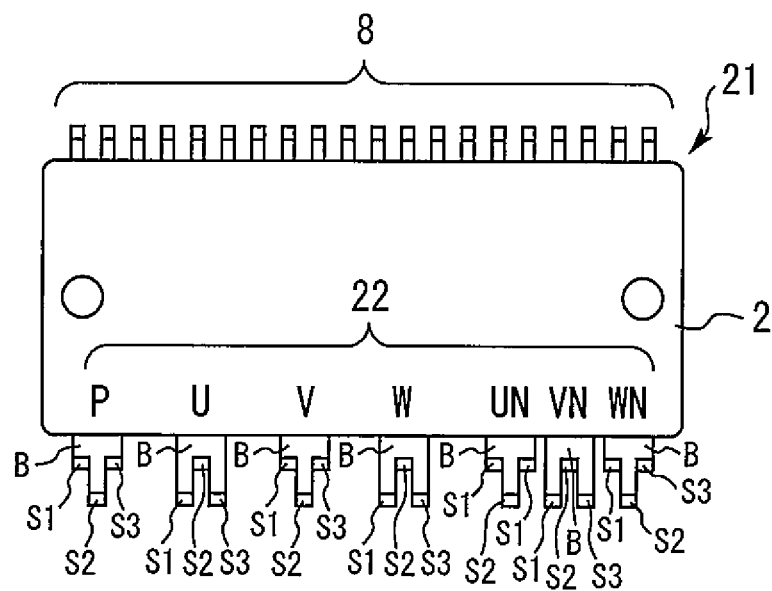
FIG. 4 is a bottom view of a semiconductor device according to the second embodiment of the present invention.
Figure 5:
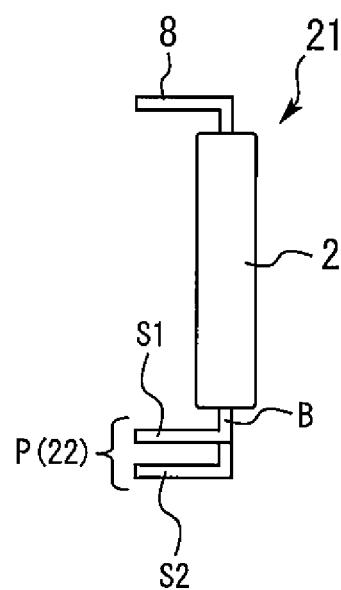
FIG. 5 is a side view of the semiconductor device in FIG. 4.

Next, a second embodiment of the present invention will be described with reference to FIG. 4 and FIG. 5. A feature of the present embodiment is that each main terminal is configured of a base portion and subterminals. FIG. 4 is a bottom view of a semiconductor device according to the second embodiment of the present invention. FIG. 5 is a side view of the semiconductor device. As shown in these drawings, a semiconductor device 21 of the present embodiment has a configuration substantially similar to that of the first embodiment, but individual main terminals 22 (that is, main terminals P, U, V, W, UN, VN, WN) are each configured of a base portion B, and subterminals S1, S2 and S3. The base portion B and the subterminals S1, S2 and S3 are integrally formed, for example, of the same metal material.

In other words, the base portion B of the main terminal 22 constitutes a region on the proximal end side connected to a package 2. Furthermore, the subterminals S1, S2 and S3 constitute a distal end portion of the main terminal 22, project from the base portion B and are bent. That is, the proximal end sides of the subterminals S1, S2 and S3 are integrated as the base portion B. This makes it possible to further reduce the size of the main terminal while securing the cross-sectional area of each main terminal 22. Therefore, the semiconductor device 21 can be further downsized. Moreover, the cross-sectional area of the main terminal 7 increases at the position of the base portion B compared to the positions of the subterminals S1, S2 and S3, and thus the base portion B can improve heat dissipation of the semiconductor circuit 3.

Note that although the semiconductor device 1 provided with the seven main terminals P, U, V, W, UN, VN and WN has been shown in the embodiments, the present invention is not limited to this, but is applicable to a semiconductor device provided with any given number of main terminals. In the present invention, all the main terminals need not be configured of subterminals, but at least one main terminal can be formed of subterminals. A case has been illustrated in the present invention where one main terminal 7 is configured of three subterminals S1, S2 and S3. However, the present invention is not limited to this, but the number of subterminals making up the same main terminal may be set to any given number equal to or greater than two.

In the present invention, a three-phase inverter circuit capable of outputting three phase currents (phase voltages) has been shown as the semiconductor circuit 3. However, the present invention is not limited to this, but the present invention may also be applied to a multi-phase inverter circuit having two phases or four or more phases. Furthermore, although the inverter circuit having the IGBT 4 and FWD 5 has been shown as the semiconductor circuit 3 in the present invention, the present invention is not limited to this, but the present invention is also applicable to an inverter circuit without using the IGBT 4 or FWD 5, or is also applicable to various semiconductor circuits other than the inverter circuit.

REFERENCE SIGNS LIST 1, 21 semiconductor device
2 package
3 semiconductor circuit
4 IGBT
5 FWD
6 control circuit
7, 22, P, U, V, W, UN, VN, WN main terminal
8 control terminal
S1, S2, S3 subterminal
B base portion
a, b interval size

The invention claimed is:

1. A semiconductor device comprising:
a package making up a contour;
a semiconductor circuit that is accommodated in the package and controls a main current according to a control signal from outside;
a control terminal that projects from the package and configured to input a control signal to the semiconductor circuit;
a plurality of main terminals, each main terminal configured to carry main current of the semiconductor circuit, the plurality of main terminals each having different respective functions for the semiconductor circuit;
at least one main terminal of the plurality of main terminals including a plurality of subterminals branching from an end portion of the one main terminal and projecting to an exterior of the package at mutually neighboring positions;
distal end portions of each of the plurality of subterminals making up the same main terminal are bent, and bending positions of the subterminals differ between the mutually neighboring subterminals in a staggered form such that the bending positions of alternating subterminals are equal; and
an interval size between two mutually neighboring subterminals making up the same main terminal is set to be smaller than an interval size between two mutually neighboring main terminals.

2. The semiconductor device according to claim 1,
the main terminal comprises a base portion that projects from the package, and
the plurality of subterminals making up the main terminal project from the base portion.

3. The semiconductor device according to claim 1, the semiconductor circuit is a multi-phase inverter circuit with at least three or more phases.

4. The semiconductor device according to claim 1, at least part of the semiconductor circuit is configured of a wide band gap semiconductor of any one of silicon carbide (SiC), nitride gallium (GaN) and diamond.

5. The semiconductor device according to claim 1, wherein
the plurality of main terminals includes a plurality of main terminals each including a plurality of respective subterminals, and
the bending positions of neighboring subterminals on adjacent main terminals are alternately staggered such that the bending positions of alternating subterminals are equal.

6. A semiconductor device comprising:
a package making up a contour;
a semiconductor circuit that is accommodated in the package and controls a main current according to a control signal from outside;
a control terminal that projects from the package and configured to input a control signal to the semiconductor circuit; and
a plurality of main terminals, each main terminal comprising at least three subterminals, wherein
the plurality of main terminals comprises a plurality of first main terminals and a plurality of second main terminals,
the first main terminals and the second main terminals alternate along the contour of the package,
a middle subterminal of each first main terminal is bent at a position further away from the contour of the package than adjacent subterminals of the first main terminal, and
a middle subterminal of each second main terminal is bent at a position closer to the contour of the package than adjacent subterminals of the second main terminal.

7. A semiconductor device comprising:
a package making up a contour;
a semiconductor circuit that is accommodated in the package and controls a main current according to a control signal from outside;
a control terminal that projects from the package and inputs a control signal to the semiconductor circuit;
a plurality of main terminals that are terminals configured to carry a main current to the semiconductor circuit, the plurality of main terminals each having different respective functions for the semiconductor circuit;
at least one main terminal of the plurality of main terminals including a plurality of subterminals, the one main terminal being formed by integrally forming the plurality of subterminals, the plurality of subterminals projecting to an exterior of the package at mutually neighboring positions;
distal end portions of each of the plurality of subterminals making up the same main terminal are bent, and bending positions of the subterminals differ between the mutually neighboring subterminals in a staggered form such that the bending positions of alternating subterminals are equal; and
an interval size between two mutually neighboring subterminals making up the same main terminal is set to be smaller than an interval size between two mutually neighboring main terminals.

* * * * *